Figure 1:
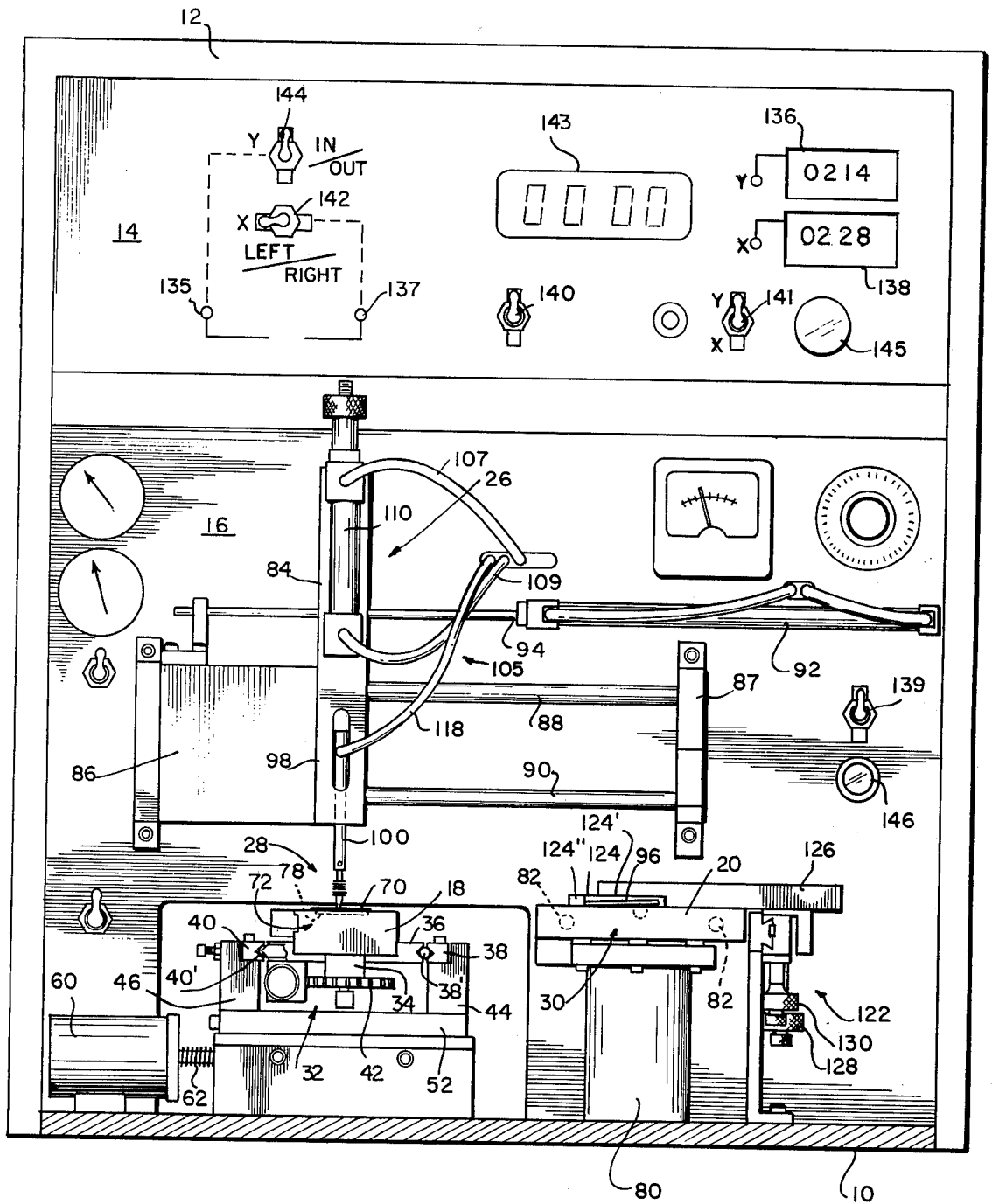

United States Patent [19]
Butler et al.

[11] 3,964,664
[45] June 22, 1976

[54] BEAM LEADED DEVICE WELDING MACHINE

[75] Inventors: Steven J. Butler, Frankfort; Arthur Harley Clawson, Jr.; Robert Jackie Ward, both of Attica, all of Ind.

[73] Assignee: P. R. Mallory & Co., Inc., Indianapolis, Ind.

[22] Filed: Aug. 20, 1975

[21] Appl. No.: 605,990

Related U.S. Application Data

[63] Continuation-in-part of Ser. No. 450,563, March 13, 1974, Pat. No. 3,920,949.

[52] U.S. Cl. ............................................. 228/6 A
[51] Int. Cl.² ........................................ B23K 31/00
[58] Field of Search .............. 228/4.1, 4.5, 6, 47, 228/49, 179, 180; 219/85, 119, 120, 158

[56] References Cited
UNITED STATES PATENTS

| | | | |
|---|---|---|---|
| 3,313,464 | 4/1967 | Avedissian | 228/4.5 X |
| 3,444,612 | 5/1969 | Pennings | 228/4.5 X |
| 3,575,333 | 4/1971 | Kulicke | 228/4.1 X |
| 3,709,424 | 1/1973 | Drees | 228/4.1 X |
| 3,909,915 | 10/1975 | Phillips | 228/180 X |

*Primary Examiner*—Al Lawrence Smith
*Assistant Examiner*—Margaret Joyce
*Attorney, Agent, or Firm*—Hoffmann, Meyer & Hanson

[57] ABSTRACT

A sleeve is held in a fixed position as a heating rod, which surrounds the sleeve, is lowered to engage an element carried by the sleeve so as to disengage the element from the sleeve and weld it to a substrate.

3 Claims, 7 Drawing Figures

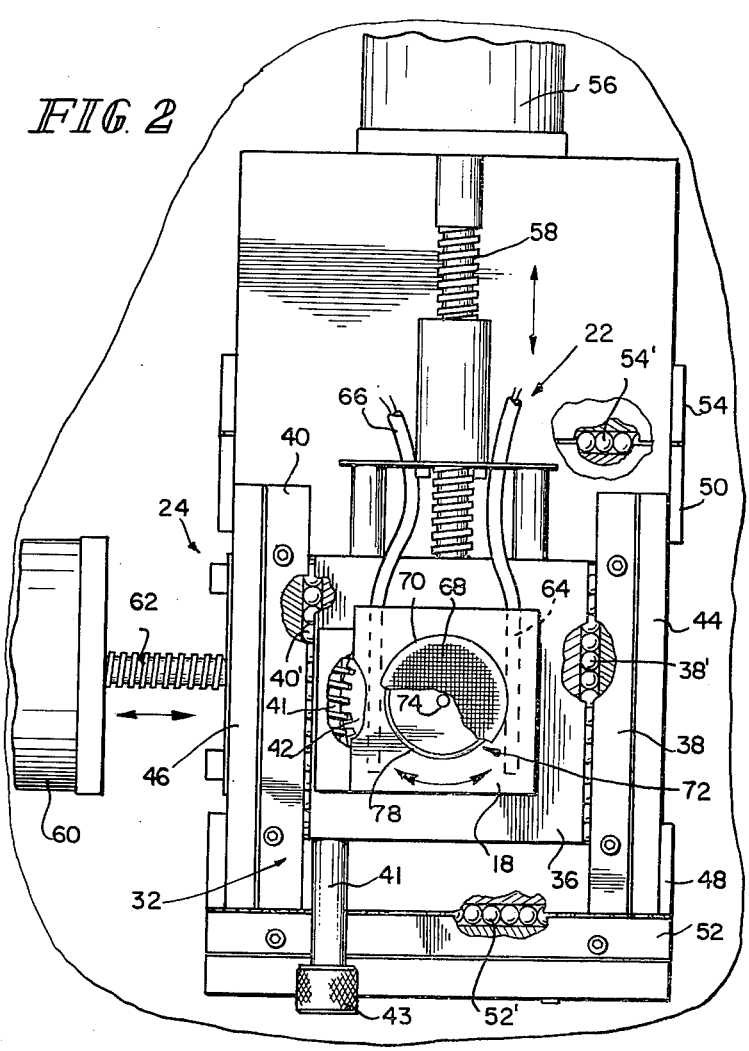
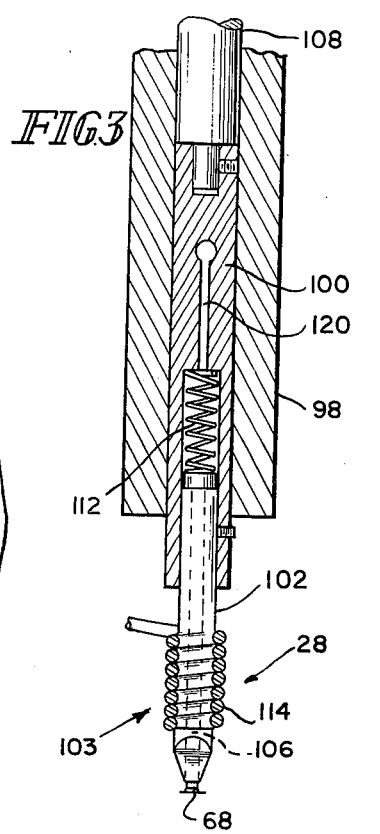
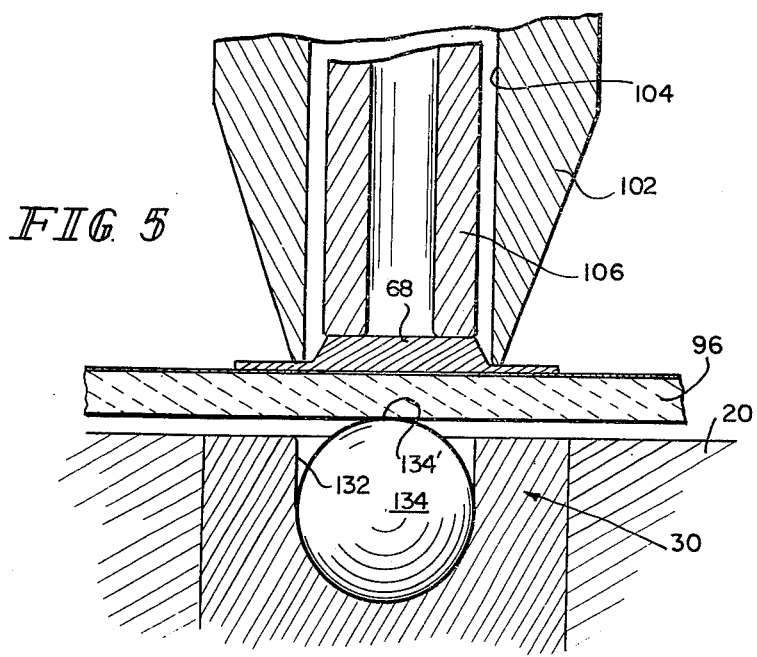
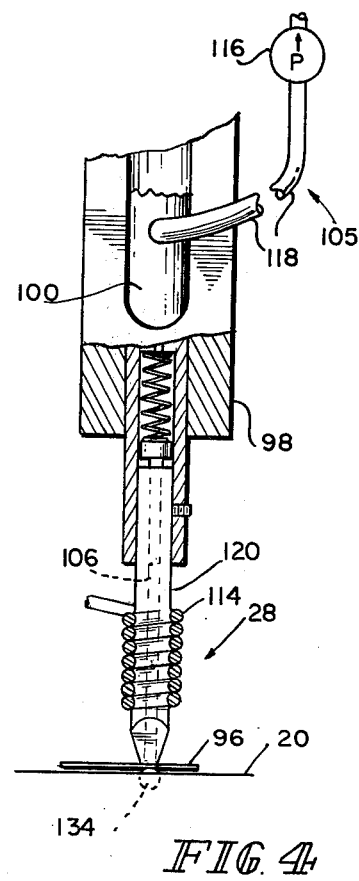
FIG. 2
FIG. 3
FIG. 5
FIG. 4

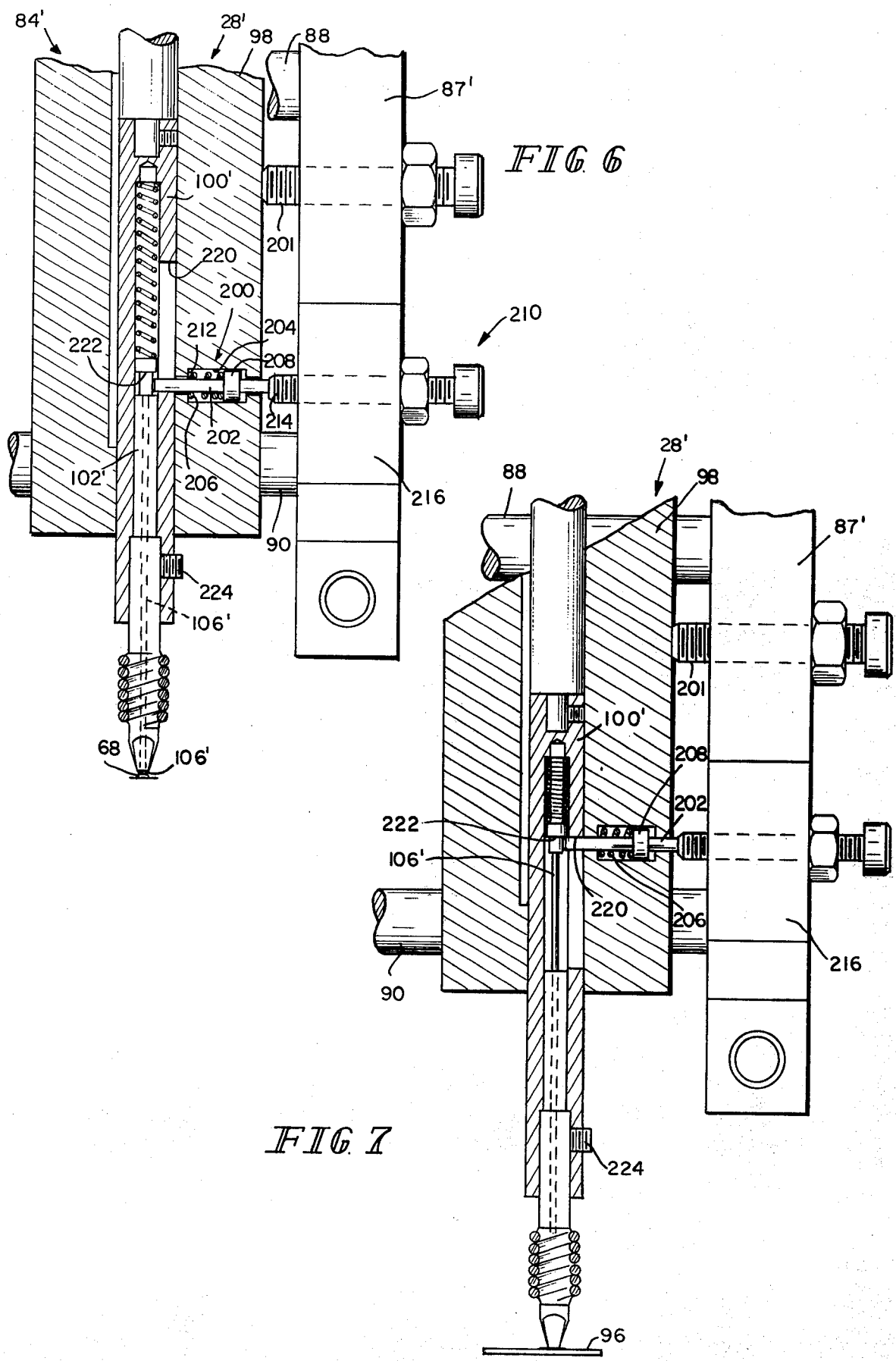

BEAM LEADED DEVICE WELDING MACHINE

This is a continuation-in-part of application Ser. No. 450,563 filed Mar. 13, 1974, now U.S. Pat. No. 3,920,949.

Generally speaking, the present invention relates to an apparatus for attaching elements to a substrate which comprises: a first heated platform receiving a base member having a multiplicity of the elements thereon; means indexing the platform in two directions substantially normal to each other; a second heated platform receiving a substrate; transfer means transferring at least one element from the first heated platform to the second heated platform; welding means carried by the transfer means; and adjusting means carried by the second heated platform for adjusting the position of the substrate carrying the element in relation to the welding means so as to enable substantially equal pressure to be applied to the element. A holding means in cooperation with an adjustable stop means maintains the welding means in a predetermined position.

The apparatus of the present invention has been found to be particularly useful for attaching semiconductive devices to substrates having electrical circuits and terminals thereon. A multiplicity of such semiconductive devices (transistors, for example) usually are provided on wafers, the devices then being transferred to the substrate and connected to electrical terminals. Because of the relatively small size of a typical chip carrying the semiconductive device, the process of transferring and bonding the chip to the substrate has been, for the most part, done by hand and thus was a very costly and time consuming procedure. In addition, the devices are normally carried on the wafer with the aid of a suitable holding medium such as wax. In order to transfer the device, such wax has to be melted.

Accordingly, it is a feature of the present invention to provide an apparatus for transferring elements from a base member to a substrate and attaching the elements to the substrate. Another feature of the invention is the provision of such an apparatus having two heated platforms, one receiving a base member carrying the elements, the other receiving a substrate to which the element is to be attached. A further feature of the invention is the provision of such an apparatus having a transfer means and a welding means, constructed as a single unit. Still another feature of the invention is the provision of such an apparatus wherein there is a means for indexing one of the platforms in two directions substantially normal to each other. Yet still another feature of the invention is the provision of such an apparatus wherein there is a means adjusting the substrate to which the elements are to be welded so as to provide substantially equal pressure to the element. Another feature of the invention is to provide a material working apparatus wherein a ball and socket arrangement provides a one-point contact with the material so that the material may be adjusted with respect to a material working tool. Still another feature of the invention is the provision of such an apparatus wherein a holding means cooperates with an adjustable stop means to maintain the welding means in a predetermined direction.

These and other features of the invention will become apparent from the following description taken in conjunction with the accompanying drawings wherein:

FIG. 1 is a front view of the apparatus;
FIG. 2 is a top view of a platform of the apparatus;
FIG. 3 is a cross-section of a pickup and welding means of the apparatus;
FIG. 4 is a view similar to FIG. 3 showing the pickup and welding means in a different operating position; and
FIG. 5 is an enlarged cross-section taken from FIG. 4 showing the combination pickup and welding means and its relationship to an element and a substrate to which it is being attached.

FIGS. 6 and 7 are views similar to FIG. 3 showing another embodiment of the invention in two different operating positions.

Referring to the drawings, the apparatus of the invention is contained within a compartment comprised of a base 10 and an enclosure 12. There are instrument panels 14 and 16 upon which various dials, indicators, and switches are carried. In general, the apparatus comprises a first heated platform 18, a second heated platform 20, means 22 and 24 indexing the first platform in two directions substantially normal to each other, transfer means 26, welding means 28, and adjusting means 30 carried in the second heated platform 20. There is also an alignment means 32 which, as will be hereinafter described, aligns an element to be transferred with the transfer means 26.

Platform 18 is carried on a hub 34, the hub and the platform being rotatably journalled in plate 36. Plate 36 is translatable in guide bars 38 and 40 through bearings 38' and 40' respectively. Hub 34 is carried on gear 42. Bars 38 and 40 are carried on supports 44 and 46 which in turn are carried on base members 48 and 50. Base members 48 and 50 are translatable in races 52 and 54 through bearings 52' and 54' respectively. Thus platform 18 is indexable in two directions, substantially normal to each other, through plate 36 and indexing means 22 and 24. Indexing means 22 includes motor 56 and worm 58, while indexing means 24 includes motor 60 and worm 62. Plate 36 is movable in one direction through motor 56 and worm 58, the worm being suitably connected to the plate. Plate 36 is also movable in a direction substantially normal to the other direction of movement through motor 60 and worm 62, supports 48, 50 and supports 44, 46, the worm 62 being suitably connected to supports 44 and 46.

The platform may be also rotationally aligned through alignment means 32. Alignment means 32 includes gear 42 which engages worm 41 which is manually turned through know 43.

The platform is heated through suitable electrical heating coils 64 which are connected to a suitable power source (not shown) through electrical leads 66.

The heated platform 18 receives a multiplicity of elements 68 which are carried by a base member 70. In the illustrative embodiment, a multiplicity of semiconductive devices are carried on a glass wafer in a wax matrix. The base member is securely held to the platform through a means 72 applying a vacuum pressure to the base member. Such means include an aperture 74 in platform 18 to which a vacuum pressure can be applied and a sealing ring 78 carrying the base member.

A second heated platform 20 is carried on a pedestal 80. The platform is heated through electrical heating coils 82 which are connected to a suitable power source (not shown).

The elements 68 are transferred from the first platform to the second platform through transfer means 26. Transfer means 26 includes a pickup head 84 which is translatable horizontally through carriage 86 which moves along bars 88 and 90, the movement being generated through a fluid cylinder (such as air) 92 and piston 94. There is a welding means for welding the elements being transferred to a substrate 96, the welding means being constructed with the pickup head 84 so as to provide a single unit for the two functional operations. Referring particularly to FIGS. 1 and 3–5, the complete unit includes a sleeve 98, a tool holder 100 movable within the sleeve, a heating rod 102 carried in the tool holder, means 103 applying heat to the heating rod, a bore 104 in the heating rod, a spring biased sleeve 106 movable in the base, and means 105 applying a vacuum pressure through the spring biased sleeve. Holder 100 is connected to a piston 108 which is operated by an air cylinder 110, the air being supplied from a suitable source (not shown) through hoses 107 and 109 (FIG. 1). Sleeve 106 is spring biased through a coil spring 112. Heating means 103 includes an electrical resistance coil 114 which is connected to a suitable electrical power source (not shown). The means 105 applying a vacuum pressure to sleeve 106 includes a pump 116 and a hose 118 connecting the pump to a conduit 120 which is in communication with bore 104. Bars 88 and 90 are carried in frame 87.

Substrate 96 is properly positioned on platform 20 through positioning means 122. For example, if the substrate is a printed electrical circuit and the element to be attached to the substrate is a transistor, then the substrate will have to be positioned such that the transfer means will place the transistor for the proper lead connections. Positioning means 122 includes an L-shaped frame 124, bar 126 and a pair of screws 128 and 130 which causes movement of the bar in two directions, normal to each other. As shown the L-shaped frame 124 includes two legs 124' and 124" against which the substrate is biased. Movement of the L-shaped frame is accomplished by leg 124' being connected to bar 126.

The substrate is positioned by the L-shaped frame 124 with respect to the end of the horizontal travel of the transfer means, the termination of the travel being such that the single unit of the pickup head 84 and heating rod 102 is aligned with adjusting means 30. As more clearly shown in FIG. 5, adjusting means 30 includes a socket 132 carried in platform 20, and a ball 134 carried in the socket, a portion 134' of which extends out of the socket to engage substrate 96. As will be hereinafter described, the use of the ball and socket arrangement provides a one point contact with the substrate 96 through which pressure equalization between the heating rod 102 and the element 68 which is being welded to the substrate may be provided.

FIGS. 6 and 7 illustrates another embodiment of the invention wherein the welding means 28' is held in a predetermined position with respect to the element being welded. More specifically a holding means 200 cooperates with an adjustable stop means 210 to maintain the spring biased sleeve 106' in a predetermined position. Holding means 200 includes a spring biased rod 202 carried in a bore 204 of sleeve 98, the rod being spring biased through spring 206 which is trapped between collar 208 and a wall 212 of the bore. Adjustable stop means 210 includes a screw 214 threaded through a block 216, the block being carried by frame 87' which carried rods 88 and 90.

OPERATION

In the operation of the embodiment of FIGS. 1–5, and with particular reference to FIGS. 1 and 2, base member 70 is first positioned on platform 18. A vacuum pressure is applied to the base member to hold it against ring 78. Pickup head 84 of transfer means 26 and more particularly sleeve 106 (FIG. 5), is aligned with an element 68 near a periphery of the base member. Then the platform is indexed through indexing means 24 to substantially align the pickup head with a second element at an opposite periphery. Exact alignment between the pickup head and the second element is then achieved by worm 41 and gear 42. A further check can be made, if desired, by repeating the process with different elements.

The amount of desired incremental indexing is programmed into indexing means 22 and 24. For semiconductive elements carried on a wafer, the amount of incremented indexing would be the distance between the elements. Thus both the "X-axis" (indexing means 24) and "Y-axis" (indexing means 22) is set for a definite amount of movement. Windows 136 and 138 indicate the size of increments being made in a particular direction. The increments that the indexing means 22 and 24 advance the platform are programmed into a suitable timing mechanism (not shown) which incremently energizes motors 56 and 60. Such timing mechanism also programs the sequential operations of the other parts of the system, such as, the application of vacuum pressure, and operation of the transfer means.

The substrate to which the element 68 is to be applied is properly positioned on platform 20 with the aid of the L-shaped frame 124 of positioning means 122.

Power is supplied to the heaters, and timers (not shown) through switch 139. Power is supplied to the motors and the indicators of panel 14 through switch 140. Heat is applied to heating rod 102 through coil 114. Heat is also applied to the platforms 18 and 20.

Transfer means 26 is positioned over platform 18 in line with an element 68. Exact alignment between the pickup head 84 and an element can be achieved by depressing either button 135 or 137 to "jog" platform 18 in either the X or Y axis through motors 56 and 60 and their respective worms 58 and 62. The direction of the "jogging" takes place is determined by the position of switches 142 and 144. Assuming that the first element to be transferred is at the left side of platform 18 (looking toward the apparatus) switch 142 is thrown to the left so that motor 60 may be energized to index platform 18 to the left so as to align each succeeding element to the right. Switch 141 is thrown to the X-axis to complete a circuit to motor 60 and to also complete a circuit to indicator 143. Such indicator indicates the position of the pickup head 84 with respect to the elements as it moves over the base member along the X-axis. Cycle start button 146 is then depressed to start a cycle. Sleeve 106 and holder 100 are lowered to engage the element. A vacuum pressure is applied to the element to remove it from the base member 70 and hold it to the end of the sleeve. Sleeve 106 and holder 100 are retracted and the transfer means 26 is moved to a position over substrate 96 on platform 20. Holder 100 and sleeve 106 are again lowered to position the transferred element on the substrate. Heating rod 102 is lowered to weld the element to the substrate through the application of heat and pressure. The vacuum pressure to sleeve 106 is released and the sleeve and holder retracted. Pickup head 84 is then positioned over platform 18 and motor 60 indexes the platform through worm 62, to align an element adjacent the previous element that was transferred with the pickup head. A new substrate is positioned on platform 20 and the cycle is repeated by depressing button 146. When all of the elements in the direction of the X-axis have been transferred, switch 141 is thrown to the Y-axis to complete an electrical circuit to motor 56, switch 144 having been previously thrown to index platform 18 along the Y-axis in the proper direction, depending upon which next succeeding row of elements is to be transferred. As in the case of the X-axis, an electrical circuit is also completed to indicator 143 to indicate the position of pickup head 84 in the Y-axis. When platform 18 has been indexed through motor 56 and worm 58 to align the pickup head with an element in the next row, switch 141 is thrown to the X-axis and the cycles separated.

As previously described, when the weld is made between the element and the substrate, uniform pressure between the heating rod 102 and the element is achieved through the one point contact of the substrate with the ball 134 that is carried in socket 132.

Where the element 68 is a transistor carried in a wafer which serves as base member 70, the transistors themselves are tested in the wafer, prior to being transferred to a substrate and if found to be unsatisfactory they are identified. When it is seen that such an element is about to be picked up on an upcoming cycle, the operator may skip such element by depressing button 146 to complete a separate electrical circuit to the motor 56 or 60 to index platform 18 to align the pickup head with the next element.

In the operation of FIGS. 6 and 7, and assuming that sleeve 106' is aligned with an element to be transferred, sleeve 106' is lowered to engage and pickup the element in the manner described with reference to FIGS. 1–5 and the pickup head 84' with the element is then transferred to the second heated platform 20. As the pickup head comes into alignment over substrate 96 (FIGS. 1 or 4) rod 202 engages set screw 214 to engage the rod with sleeve 106' through window 220 and slot 222 provided between heating rod 102' and the sleeve to hold the sleeve in a fixed predetermined position. Set screw 201 further limits the travel of the pickup head. Tool holder 100' is then lowered, the rod 202 being free to move within window 220 provided within the tool holder. As the tool holder is lowered, heating rod 102' is also lowered through set screw 224 as sleeve 106' remains fixed. Heating rod 102' engages the element to disengage it from sleeve 106', (FIG. 7) there being sufficient pressure exerted by the heating rod to overcome the vacuum which was holding the element to the sleeve. Heating rod 102' then engages the element with the substrate to weld it in place. Tool holder 100' is then retracted to retract the heating rod.

What is claimed is:

1. Apparatus for attaching elements to a substrate comprising:
   a. a first heated platform receiving base members each having a multiplicity of said elements thereon,
   b. means indexing said first platform in two directions substantially normal to each other,
   c. a second heating platform receiving said substrate,
   d. transfer means transferring at least one element from said first heated platform to said second heated platform comprising:
      1. a sleeve,
      2. a tool holder movable within said sleeve,
      3. a heating rod carried by said holder,
      4. a bore extending through a central axis of said heating rod,
      5. a spring biased sleeve slideably carried in said bore,
      6. means applying a vacuum pressure to said bore and said spring biased sleeve,
      7. holding means carried by said first named sleeve and engaging said spring biased sleeve to maintain same in a predetermined position, and
      8. an adjustable stop means carried by a frame holding said transfer means engaging said holding means, and
   e. adjusting means carried by said second heated platform for adjusting the position of said element in relation to said heating rod means so as to enable substantially equal pressure to be applied to said element.

2. Apparatus according to claim 1 wherein said holding means is a moveable spring biased rod carried in said first named sleeve.

3. Apparatus according to claim 1 wherein said adjustable stop means is a set screw.

* * * * *